United States Patent [19]

Wollar

[11] Patent Number: 4,784,550
[45] Date of Patent: Nov. 15, 1988

[54] TWO-PIECE FASTENER FOR RELEASABLY SECURING TWO PANELS TOGETHER IN SPACED-APART FIXED RELATIONSHIP

[75] Inventor: Burnell Wollar, Barrington, Ill.

[73] Assignee: Phillips Plastics Corporation, Phillips, Wis.

[21] Appl. No.: 907,802

[22] Filed: Sep. 16, 1986

[51] Int. Cl.⁴ ............................................. F16B 13/04
[52] U.S. Cl. ...................... 411/32; 411/60; 411/508; 411/908
[58] Field of Search ...................... 411/32, 33, 40, 41, 411/44, 45, 57, 60, 508, 15, 59, 182; 24/297; 174/138 D

[56] References Cited

U.S. PATENT DOCUMENTS

| | | | |
|---|---|---|---|
| 2,936,015 | 5/1960 | Rapata | 411/182 |
| 3,650,173 | 3/1972 | Mathe | 411/45 |
| 3,836,704 | 9/1974 | Coules | 174/138 D |
| 3,854,374 | 12/1974 | Boyle et al. | 411/57 |
| 3,893,208 | 7/1975 | Yuda | 174/138 D |
| 4,007,516 | 2/1977 | Coules | 411/57 X |
| 4,114,509 | 9/1978 | Poe | 24/607 X |
| 4,176,428 | 12/1979 | Kimura | 24/297 X |
| 4,312,165 | 1/1982 | Mizusawa | 411/510 X |
| 4,331,413 | 5/1982 | Hoen | 411/44 |
| 4,364,427 | 12/1982 | LeFrancois | 411/182 X |
| 4,435,111 | 3/1984 | Mizusawa | 411/21 X |
| 4,478,545 | 10/1984 | Mizusawa et al. | 411/57 |
| 4,502,193 | 3/1985 | Harmon et al. | 174/138 D X |
| 4,571,134 | 2/1986 | Beglinger et al. | 411/509 X |
| 4,579,473 | 4/1986 | Brugger | 411/41 X |
| 4,610,587 | 9/1986 | Wollar et al. | 411/45 X |
| 4,674,910 | 6/1987 | Hayashi | 411/508 X |
| 4,674,930 | 6/1987 | Poe et al. | 411/40 |
| 4,726,722 | 2/1988 | Wollar | 411/60 X |

FOREIGN PATENT DOCUMENTS 272583  3/1964  Australia ..................... 411/44
1955802  5/1971  Fed. Rep. of Germany ........ 411/44

Primary Examiner—Neill Wilson
Attorney, Agent, or Firm—James E. Nilles; Thomas F. Kirby

[57] ABSTRACT

A plastic re-usable two-piece push-pin stand-off fastener for releasably securing together two spaced-apart circuit boards comprises a hollow body having a body bore into which, for pre-assembly, a pin is insertable into the body bore prior to use. The pin has large and small outside diameter portions near its head and insertion ends, respectively. The body bore has large and small inside diameter bore portions near its head and insertion ends, respectively. The body also has outwardly extending inwardly depressible resilient flexible wings adjacent the large bore portion, has outwardly expandable resilient flexible legs adjacent the small bore portion, and has an external shoulder between the wings and the legs. In use, the body is inserted into a hole in the first board to entrap the board between the body head and wings. Then, the body is inserted into a hole in the second board so that the shoulder bears thereagainst. Finally, the pin is fully inserted into the bore to cause the legs to expand and entrap the second board between the shoulder and the expanded legs. Full pin insertion causes the large pin portion to enter the large bore portion to prevent the wings from flexing inwardly and locks the first board in place. Full pin withdrawal from the bore enables both boards to be disengaged from the body.

2 Claims, 2 Drawing Sheets

TWO-PIECE FASTENER FOR RELEASABLY SECURING TWO PANELS TOGETHER IN SPACED-APART FIXED RELATIONSHIP

BACKGROUND OF THE INVENTION

1. Field of Use

This invention relates generally to a two-piece re-usable plastic fastener for releasably securing two panels together in spaced-apart predetermined fixed relationship.

In particular, it relates to such a fastener which is especially well-adapted for use in securing one panel, such as an electronic circuit board, to another panel, such as another circuit board or a sheet metal panel forming part of the chassis of electronic equipment.

2. Description of the Prior Art

In some electrical or electronic equipment, for example, it is necessary to secure one planar member or panel, such as an electronic circuit board, in spaced-apart predetermined fixed relationship either to the sheet metal chassis in the equipment or to another circuit board. In some cases two or more circuit boards, which have printed or wired circuitry and electronic components thereon, are disposed in stacked arrangement. Typically, the boards are assembled and mechanically secured together and to a chassis by means of a plurality of elongated bolts (metal or plastic) which extend through drilled or punched aligned holes near the edges of the circuit boards and proper spacing between adjacent boards and between a board and the chassis (to ensure electrical isolation and clearance for board components) is achieved by means of hollow cylindrical bushings (metal or plastic) which are slipped onto the bolts as the assembly progresses. Nuts are screwed onto the ends of the bolts to complete the assembly. Or, in some cases, instead of bushings, sets of nuts may be screwed onto a bolt as each board is emplaced on the bolt to ensure desired spacing, rigidity and fixed positioning. Removal and replacement of circuit boards which are so assembled involves similar steps. Needless to say, use of the above-described prior art means and methods is time-consuming, costly and requires attention and care to insure precise spacing.

SUMMARY OF THE PRESENT INVENTION

A two-piece re-usable plastic fastener in accordance with the present invention is provided for releasably securing a primary panel to a confronting secondary panel in spaced-apart fixed relationship, and requires each of the panels to have a fastener-receiving hole therein. The fastener, which may be referred to as a push-pin stand-off fastener, comprises a body having a body head, a body shank insertable in the aligned holes in both of said panels, and a pin-receiving bore in the body. Outwardly extending inwardly depressible resilient first locking means in the form of wings are provided on the exterior of the body shank for extrapping the primary panel between the body head and the first locking means after the body shank is inserted into the fastener-receiving hole in the primary panel and after the first locking means resume the outwardly extending position. A shoulder is provided on the exterior of the body shank. Outwardly expandable resilient second locking means in the form of expandable legs are also provided on the exterior of the body shank for entrapping the secondary panel between the shoulder and the second locking means after the body shank is inserted into the fastener-receiving hole in the secondary panel and after the second locking means is expanded. The fastener further comprises a pin having a pin shank insertable into the pin-receiving bore in the body to a fully inserted position wherein it effects outward expansion of the second locking means. The pin shank, when in the fully inserted position, prevents inward depression of the first locking means to thereby prevent axial displacement of the primary panel relative to the body shank. In particular, the pin shank comprises first means in the form of a narrow shank portion which is engageable with the second locking means to effect outward expansion thereof and also comprises second means in the form of a wide shank portion which is engageable with the first locking means to prevent inward depression thereof.

More specifically, the fastener comprises a pin and a hollow body having a bore into which the pin is manually insertable. The pin and body each have a head end and an insertion end. The body bore has large and small inside diameter portions near its head and insertion ends, respectively. The body also has outwardly extending inwardly depressible resilient flexible wings adjacent the large diameter bore portion, has outwardly expandable resilient flexible legs adjacent the small diameter bore portion, and has an external shoulder between the wings and the legs. The pin has large and small outside diameter portions near its head and insertion ends, respectively. The pin is preassembled but not fully inserted into the body bore prior to use. In use, the body is inserted into a hole in a first panel so that the first panel becomes entrapped between the body head and the wings. Then, the body is inserted into a hole in a second panel so that the body shoulder bears thereagainst. Finally, the pin is fully inserted into the body bore thereby causing the body legs to expand and causing the second panel to be entrapped between the body shoulder and the expanded body legs at a fixed predetermined distance from the first panel. Full insertion of the pin causes the large diameter pin portion to enter the large diameter body bore portion and thereby prevents the wings from being flexed inwardly and locks the first panel in place. Full withdrawal of the pin from the body bore enables both panels to be disengaged from the body.

A fastener in accordance with the invention offers numerous advantages. For example, it is easily and economically fabricated by injection molding and its two constituent pieces (pin member and body member) are pre-assembled prior to use to facilitate handling and installation in the panels. It is fabricated of plastic having inherent electrical insulating properties, rather than metal, and thereby eliminates the risk of electrical short circuits and flash-over. It ensures automatic and precise spacing between the panels being joined and also provides the mechanical connection therebetween. When the fastener is fully installed on both panels, it locks each panel in fixed position relative to the fastener and relative to the other panel. It can be affixed first to one panel and then moved, along with that panel, to the other panel to which it is to be affixed. It requires only a few simple motions to effect its installation. It can be easily disengaged from one or both panels to facilitate panel removal or replacement. It can be re-used and is not destroyed or damaged when removed from associated panels. Other objects and advantages will hereinafter appear.

DRAWINGS

DESCRIPTION OF A PREFERRED EMBODIMENT

Figure 1:
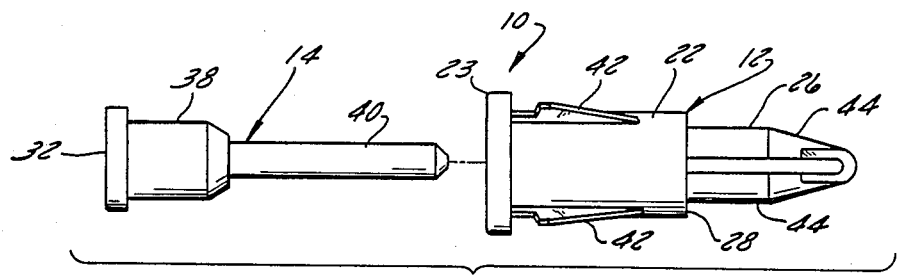
FIG. 1 is a side elevation view of a two-piece fastener in accordance with the invention and showing the pin member thereof (hereinafter called "pin") and the body member thereof (hereinafter called "body") in separated condition.
Figure 2:
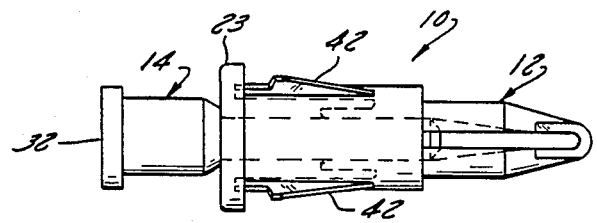
FIG. 2 is a side elevation view showing the pin and body of the fastener in pre-assembled condition but prior to installation.
Figure 3:
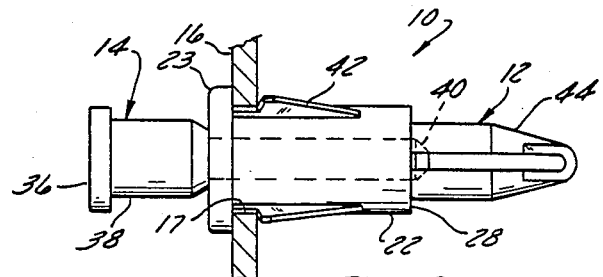
FIG. 3 is a side elevation view of the pre-assembled fastener and showing its body installed in a hole in a first panel (shown in cross-section)
Figure 4:
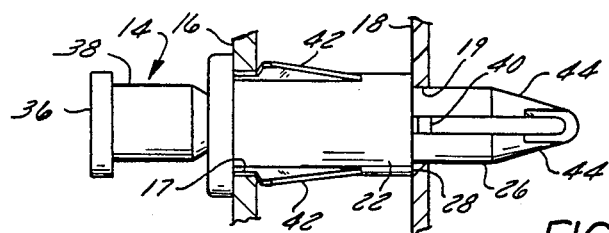
FIG. 4 is a side elevation view of the pre-assembled fastener and showing it installed in the hole in the first panel (shown in cross-section) and also disposed in a hole in a second panel (shown in cross-section)
Figure 5:
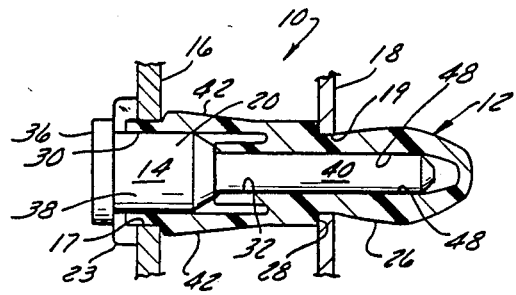
FIG. 5 is a side elevation view of the fastener showing it in fully installed condition, with the pin fully inserted in the body, and with the body in locked engagement with both panels.
Figure 7:
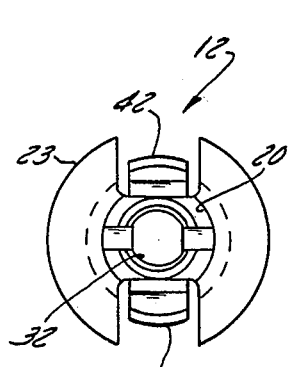
FIG. 7 is an elevation view of the head end of the fastener body of FIG. 6.
Figure 6:
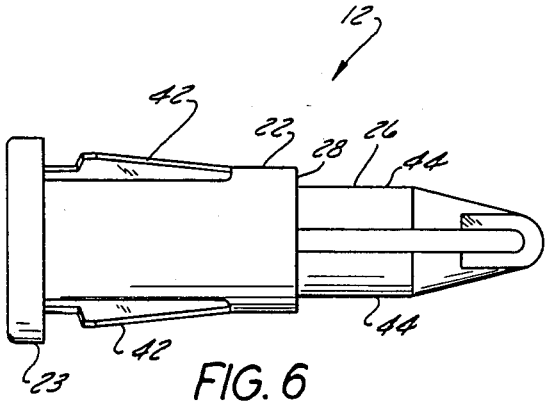
FIG. 6 is a greatly enlarged elevation view of one side of the fastener body shown in FIG. 1.
Figure 8:
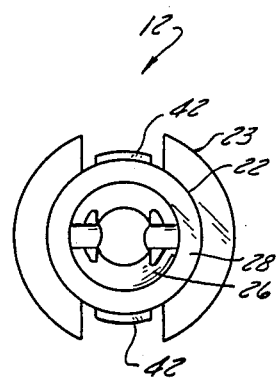
FIG. 8 is an elevation view of the insertion end of the fastener body of FIG. 6.
Figure 9:
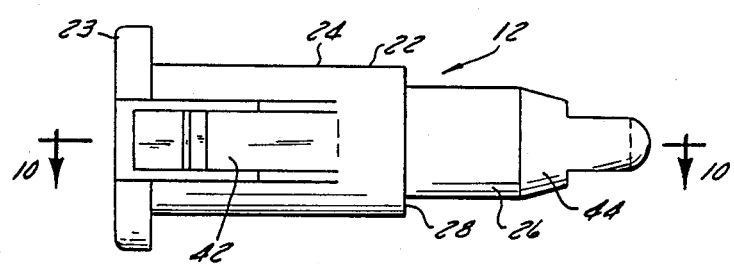
FIG. 9 is an elevation view of another side of the fastener body.
Figure 10:
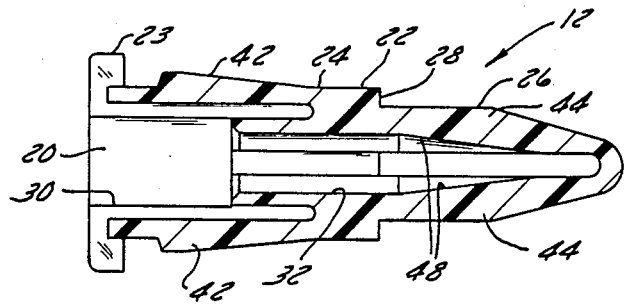
FIG. 10 is a cross-section view of the fastener body taken on line 10—10 of FIG. 9.
Figure 12:
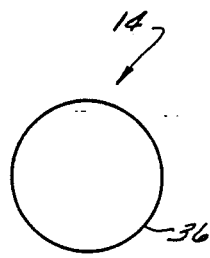
FIG. 12 is an elevation view of the head end of the pin shown in FIG. 11.
Figure 11:
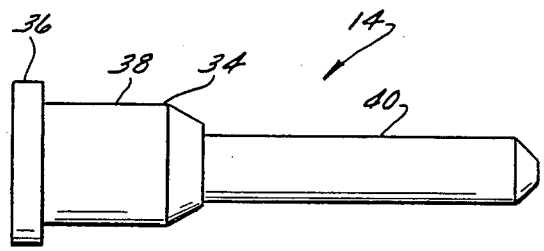
FIG. 11 is a greatly enlarged side elevation view of the pin shown in FIG. 1.
Figure 13:
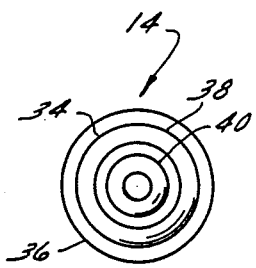
FIG. 13 is an elevation view of the insertion end of the pin shown in FIG. 11.

Referring to FIG. 1, number 10 designates a two-piece reusable fastener in accordance with the invention which comprises a one-piece molded plastic hollow body 12 and a one-piece pin 14, of molded plastic or metal, which is insertable into body 12. Fastener 10 is used, as FIG. 5 shows, to releasably secure together two panels 16 and 18 in predetermined spaced-apart fixed relationship. FIG. 1 shows body 12 and pin 14 separated. FIG. 2 shows body 12 and pin 14 of fastener 10 in pre-assembled conditions prior to use. FIG. 3 shows pre-assembled fastener 10 installed in a hole 17 in primary panel 16 and secured thereto. FIG. 4 shows pre-assembled fastener 10 secured to primary panel 16 and inserted in a hole 19 in secondary panel 18 but not yet secured thereto. FIG. 5 shows fastener 10 in fully installed or fully set condition wherein both panels 16 and 18 are secured in fixed spaced-apart position relative to fastener 10 and to each other.

Referring to FIGS. 1 and 6 through 10, body 12 has a pin-receiving bore 20 therethrough and comprises a body shank 22 having an insertion end (right end in the drawing figures) and a body head 23 at its opposite or head end (left end in the drawing figures). Body shank 22 has a large diameter body shank portion 24 near its head end and a small diameter body shank portion 26 near its insertion end, with a body shoulder 28 between those body shank portions. Pin-receiving bore 20 has a large diameter bore portion 30 near its head end and a small diameter portion 32 near its insertion end.

Referring to FIGS. 1 and 11 through 13, pin 14 comprises a pin shank 34 having an insertion end (right end in the drawing figures) and a pin head 36 at its opposite or head end (left end in the drawing figures). Pin shank 34 has a large diameter pin shank portion 38 near its head end and a small diameter pin shank portion 40 near its insertion end.

Body shank 22 has a plurality of (two) inwardly depressible panel-engageable flexible resilient wings 42 near its head end (and adjacent and partially defining the large diameter body bore portion 30 of body 12) and has a plurality of (two) outwardly expandable panel-engaging legs 44 near its insertion end (and adjacent and partially defining the small diameter body bore portion 32 of body 12). After manufacture, the two separate pieces 12 and 14 are pre-assembled (FIG. 2), i.e., pin 14 is partially inserted into body bore 20 so that the small diameter pin shank portion 40 is received in the small diameter body bore portion 32 but so that the large diameter pin shank portion 38 remains entirely outside of the large diameter body bore portion 30 and does not interfere with inward flexing of the wings 42.

In use, as FIG. 3 shows, the insertion end of body 12 is inserted into a hole 17 in first panel 16 so that first panel 16 is entrapped between body head 23 and the resilient wings 42. Then, as FIG. 4 shows, the insertion end of body shank portion 26 is inserted into a hole 19 in second panel 18. Finally, as FIG. 5 shows, pin 14 is fully inserted (manually or with a tool) into body bore 20 so that the small diameter pin shank portion 40 fully enters the small diameter body bore portion 32 and tapered portion 26 and engages the ramps 48 to cause the body legs 44 to expand and to entrap second panel 18 between body shoulder 28 and the expanded body legs 44 at a fixed predetermined distance from first panel 16. As FIG. 5 shows, upon full insertion of pin 14, the large diameter pin shank portion 38 enters the large diameter body bore portion 30 and thereby prevents inward flexing of the wings 42 (compare FIGS. 5 and 10) and securely locks first panel 16 in fixed position on body 12.

Withdrawal of pin 14 from body bore 20 to its pre-assembled position shown in FIG. 4 causes the legs 44 to retract from their expanded position thereby enabling second panel 18 to be disengaged from body 12 and allows the wings 42 to be manually depressed (bore portion 30 being clear, allows this) thereby enabling first panel 16 to be disengaged from body 12.

I claim:

1. A two-piece push-in stand-off fastener (10) for releasably securing a primary panel (16) and a secondary panel (18) together in spaced apart fixed relationship, each panel having a fastener, receiving hole (17, 19) therein, said fastener (10) comprising:

a body (12) having a body head (23), a body shank (22) including a wide shank portion (24) and a narrow shank portion (26), a shoulder (28) on said body shank (22) between said shank portions (24, 26) and defined by the insertion end of said wide shank portion (24), a bore (20) comprising a narrow bore portion (32) and a wide bore portion (30) near the insertion and head ends, respectively, of said body shank (22), and first and second locking means on said wide shank portion (24) and said narrow shank portion (26), respectively, of said body shank (22);

said first locking means comprising a resilient flexible wing (42) having an extended position wherein it projects outwardly of said body shank (22) and a depressed position wherein it projects inwardly into said wide bore portion (30), said wing (42) being resiliently movable between said extended and retracted positions through an opening in said body shank (22);

said second locking means comprising a ramp (48) on said narrow shank portion (22) within said narrow bore portion (32) and a resiliently movable leg (44) having an unexpanded position and an expanded position wherein it projects outwardly of said body shank (22), said leg (44) being resiliently movable between said unexpanded and expanded positions;

and a pin (14) having a pin head (36) and a pin shank (34) comprising a narrow pin portion (40) and an unthreaded wide pin portion (38) near the insertion and head ends, respectively, of said pin shank (34);

said pin shank (34) being initially insertable axially and non-rotatably into said bore (20) to a pre-assembled position wherein said wide pin portion (38) is disposed in non-interfering relationship with said first locking means (42) and wherein said narrow pin portion (40) extends only partway into said narrow bore portion (32) to thereby allow said wing (42) to move from its outwardly projecting position to depressed position as said wide shank portion (24) is inserted through the hole (17) in said primary panel (16) and to allow said second leg (44) to remain in unexpanded position and thereby enabling said narrow shank portion (26) to be inserted into the hole (19) in said secondary panel (18);

said pin shank (34) being further insertable axially and non-rotatably into said bore (20) to a fully inserted position wherein said narrow pin portion (40) extends fully into said narrow bore portion (32) and engages said ramp (48) to thereby effect movement of said leg (44) to said expanded position wherein said secondary panel (18) is entrapped between said leg (44) and said shoulder (28), and wherein said wide pin portion (38) extends into said wide bore portion (30) in interfering relationship with said wing (42) and to prevent said wing (42) from moving to said depressed position to thereby maintain said wing (42) in said outwardly projecting position wherein said primary panel (16) is entrapped between said outwardly projecting wing (42) and said body head (23), said pin shank (34) being axially and non-rotatably removable from said bore (20) to enable said fastener (10) to be detached from said panels (16, 18).

2. A fastener (10) according to claim 1 wherein said second locking means comprises flexible resilient legs (44) integrally formed on said body shank (22) and movable between unexpanded and expanded positions, said legs (44) being integrally connected to each other at the insertion end of said body shank (22).

* * * * *